(12) United States Patent
Singletary et al.

(10) Patent No.: US 11,377,722 B2
(45) Date of Patent: Jul. 5, 2022

(54) PROCESS FOR COATING SUBSTRATES WITH APERTURE(S)

(71) Applicant: General Electric Company, Schenectady, NY (US)

(72) Inventors: David Allen Singletary, Greenville, SC (US); John Thomas Zanetti, Greenville, SC (US); Kassy Moy Hart, Greenville, SC (US); William Clifford Ross, Monroe, OH (US); Jose Troitino Lopez, Miami, FL (US); Anderson Viaro Mattos, Greenville, SC (US); Fernando Jorge Casanova, Simpsonville, SC (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 16/849,418

(22) Filed: Apr. 15, 2020

(65) Prior Publication Data
US 2021/0324507 A1     Oct. 21, 2021

(51) Int. Cl.
*B32B 3/24*     (2006.01)
*C23C 4/11*     (2016.01)
(Continued)

(52) U.S. Cl.
CPC ............ *C23C 4/11* (2016.01); *B32B 3/266* (2013.01); *B33Y 40/20* (2020.01); *B33Y 80/00* (2014.12);
(Continued)

(58) Field of Classification Search
CPC ............ B33Y 80/00; C23C 8/04; B05D 1/32
See application file for complete search history.

(56) References Cited

U.S. PATENT DOCUMENTS

| 9,551,058 B2 | 1/2017 | Reid et al. |
| 2014/0035995 A1* | 2/2014 | Chou ................ B41J 2/01 347/20 |

(Continued)

FOREIGN PATENT DOCUMENTS

| CN | 113522700 A | 10/2021 |
| EP | 2881489 A1 | 6/2015 |

(Continued)

OTHER PUBLICATIONS

European Search Report issued in connection with corresponding EP Application No. 21166107, dated May 26, 2021, 7 pages.

*Primary Examiner* — William P Watkins, III
(74) *Attorney, Agent, or Firm* — James Pemrick; Hoffman Warnick LLC

(57) ABSTRACT

A coating method for a component with at least one aperture includes providing a component having at least one aperture formed in a surface thereof; additively manufacturing a hollow member on a portion of the surface to define a space above each aperture, the portion of the surface being adjacent to the aperture, the hollow member having an inner peripheral geometry complementary to a peripheral geometry at least one of aperture; applying at least one coating over the surface of the component and around hollow member to form an applied coating having an applied coating thickness; and removing at least a portion of the hollow member to make a top portion of the hollow member coplanar with the applied coating to expose the space through the applied coating; wherein a lower portion of the hollow member remains to define the space through the applied coating.

15 Claims, 7 Drawing Sheets

(51) Int. Cl.
*B33Y 80/00* (2015.01)
*C23C 4/134* (2016.01)
*B33Y 40/20* (2020.01)
*B32B 3/26* (2006.01)
*C23C 14/08* (2006.01)
*C23C 14/30* (2006.01)
*B05D 1/32* (2006.01)
*C23C 8/04* (2006.01)

(52) U.S. Cl.
CPC .............. *C23C 4/134* (2016.01); *C23C 14/08* (2013.01); *C23C 14/30* (2013.01); *B05D 1/32* (2013.01); *C23C 8/04* (2013.01); *Y10T 428/24273* (2015.01); *Y10T 428/24322* (2015.01)

(56) References Cited

U.S. PATENT DOCUMENTS

| | | |
|---|---|---|
| 2014/0141174 A1 | 5/2014 | Garry et al. |
| 2015/0159254 A1 | 6/2015 | Reid et al. |
| 2016/0089692 A1 | 3/2016 | Reid et al. |

FOREIGN PATENT DOCUMENTS

| | | |
|---|---|---|
| EP | 3896189 A1 | 10/2021 |
| WO | 2014160695 A1 | 10/2014 |

\* cited by examiner

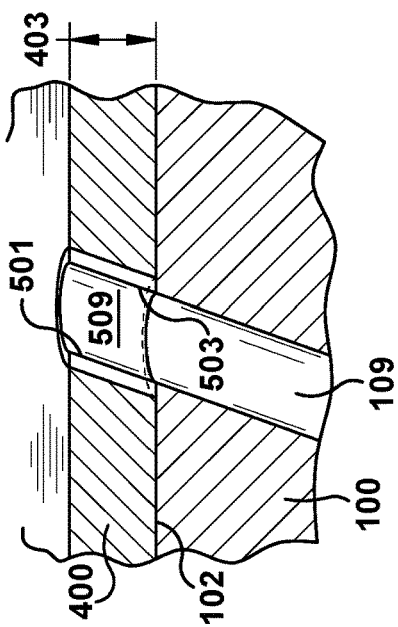
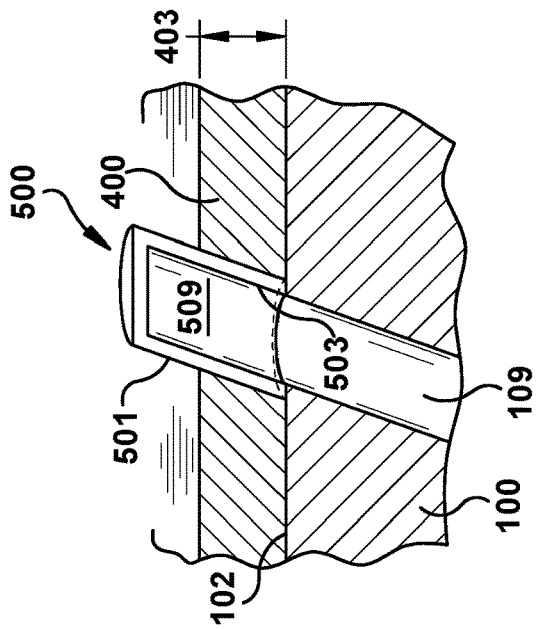
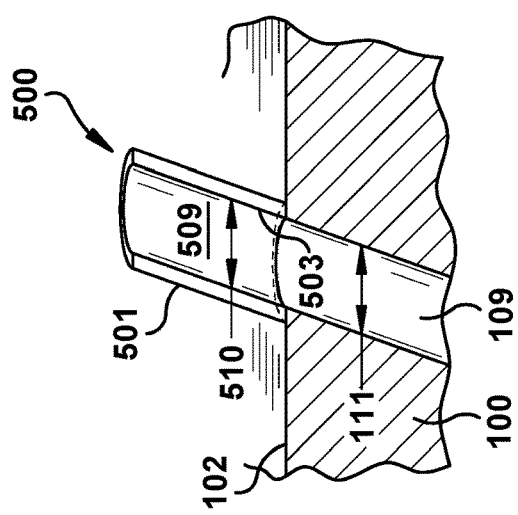

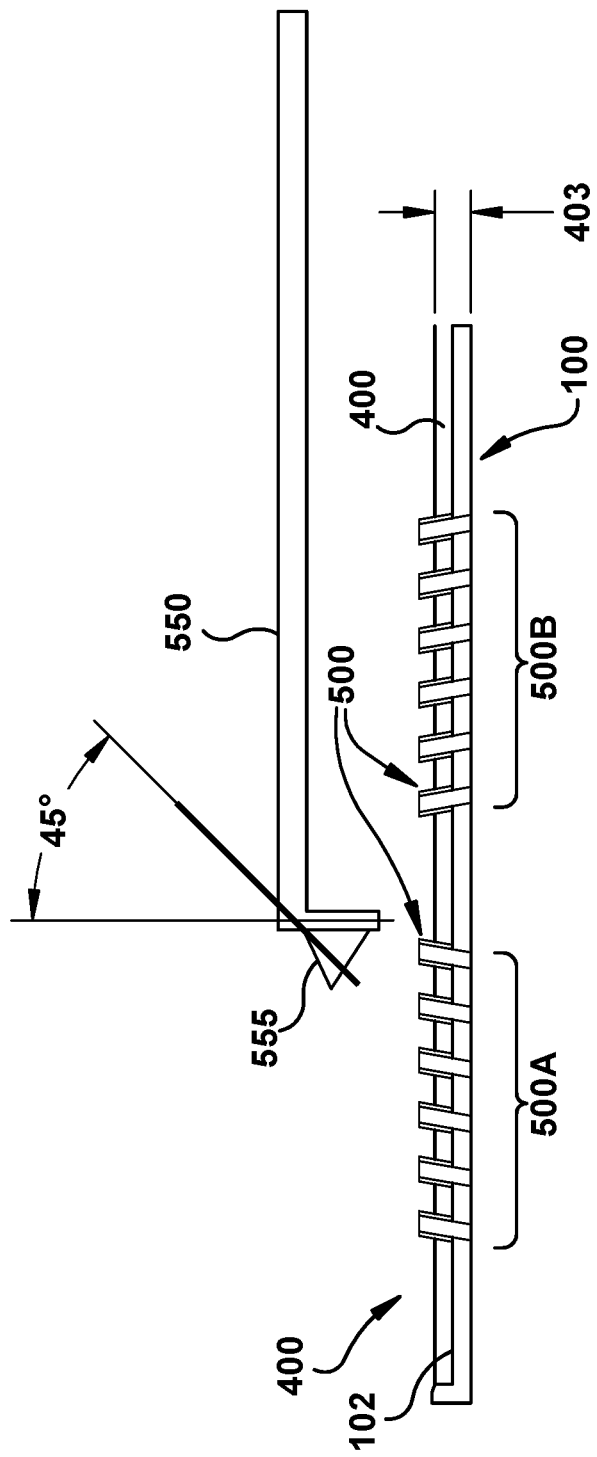

PROCESS FOR COATING SUBSTRATES WITH APERTURE(S)

BACKGROUND

The disclosure relates generally to methods for coating substrates. In particular, the present disclosure is directed to coating methods for selectively coating a substrate that includes apertures, and a coated substrate that includes apertures formed by the coating methods.

When turbines are used on aircraft or for power generation, they are typically run at a temperature as high as possible, for increased operating efficiency. Since high temperatures can damage the alloys used for the components, a variety of approaches have been used to raise the operating temperature of metal components. One approach calls for the incorporation of internal cooling channels in the component, through which cool air is forced during engine operation. Apertures or cooling holes can be formed in the substrate by techniques such as water jet processing and/or electrical discharge machining (EDM). Cooling air (usually provided by the engine's compressor) is fed through the holes from the cooler side to the hot side of a component wall. As long as the holes remain clear, the rushing air will assist in lowering the temperature of the hot metal surface and preventing melting or other degradation of the component.

Another technique for protecting the metal parts and effectively raising the practical operating temperature involves the use of a coating, such as a bond coat, a thermal barrier coating (TBC) or environmental barrier coating (EBC). A TBC is usually ceramic-based. Coating systems frequently also include a bond coat which is placed between the ceramic coating and the substrate to improve adhesion. Use of TBC's in conjunction with cooling holes is sometimes an effective means for protecting an engine part. However, incorporation of both systems can be very difficult. For example, cooling holes sometimes cannot be formed in the engine part after a TBC has been applied, since lasers usually cannot effectively penetrate both ceramic material and metal to form the pattern of holes and may possibly crack a TBC. If cooling holes are formed prior to the application of a coating system, they may become covered and at least partially obstructed when a coating is applied.

BRIEF DESCRIPTION

A first aspect of the disclosure provides a coating method for a component with at least one aperture. The coating method includes providing a component having at least one aperture formed in a surface thereof; additively manufacturing a hollow member on a portion of the surface to define a space above each aperture, the portion of the surface being adjacent to the aperture, the hollow member having an inner peripheral geometry complementary to a peripheral geometry at least one of aperture; applying at least one coating over the surface of the component and around the hollow member to form an applied coating having an applied coating thickness; and removing at least a portion of the hollow member to make a top portion of the hollow member coplanar with the applied coating to expose the space through the applied coating; wherein a lower portion of the hollow member remains to define the space through the applied coating.

A second aspect of the disclosure provides a coated component. The component includes a surface; at least one aperture formed in the surface; a coating layer on the surface, the coating layer including: at least one hollow member additively manufactured on the surface extending from the surface to a top surface, each hollow member defining a space above a respective one of the at least one aperture, a perimeter of the hollow member being coincident with each at least one aperture and having an inner peripheral geometry complementary to a peripheral geometry the respective one of the at least one of the aperture; a coating material sprayed on the surface and around the hollow member, the coating material having a top surface coplanar with a portion of the hollow member after portions of at least one of the hollow member is removed.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which:

FIG. 6 is a sectional view of a component according to another aspect of the present disclosure including a plurality of apertures with hollow members formed thereon according to the present disclosure;

FIG. 7 is a sectional view of a component according to another aspect of the present disclosure including a plurality of apertures with hollow members and coating formed thereon according to the present disclosure;

FIG. 8 is a sectional view of a component according to another aspect of the present disclosure including a plurality of apertures with hollow members and coating formed thereon with portions of hollow members removed according to the present disclosure; and FIG. 9 is an illustration of a spray apparatus with a component according to the present disclosure.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Figure 1:
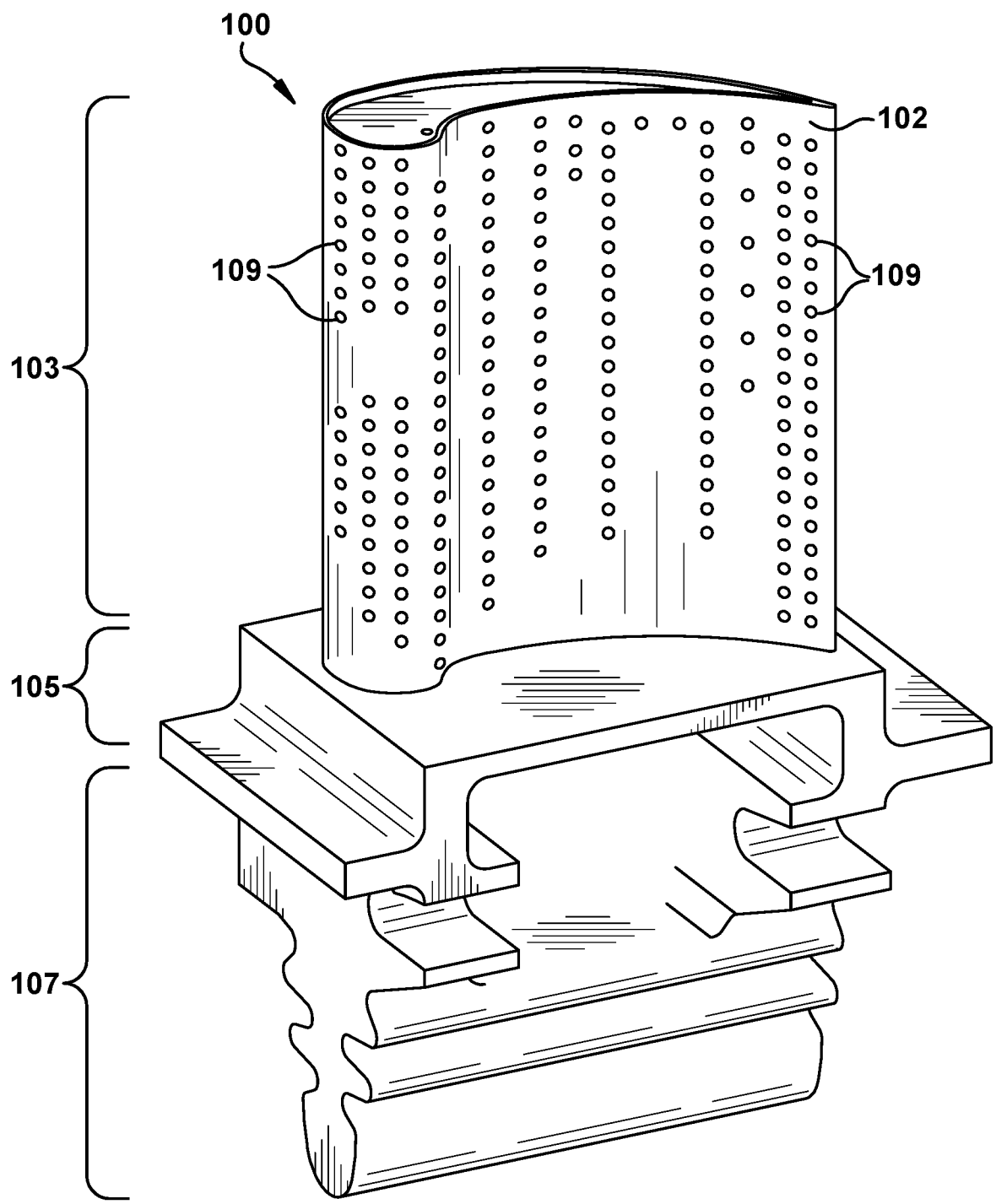
FIG. 1 is a perspective view of a component of the present disclosure.
Figure 2:
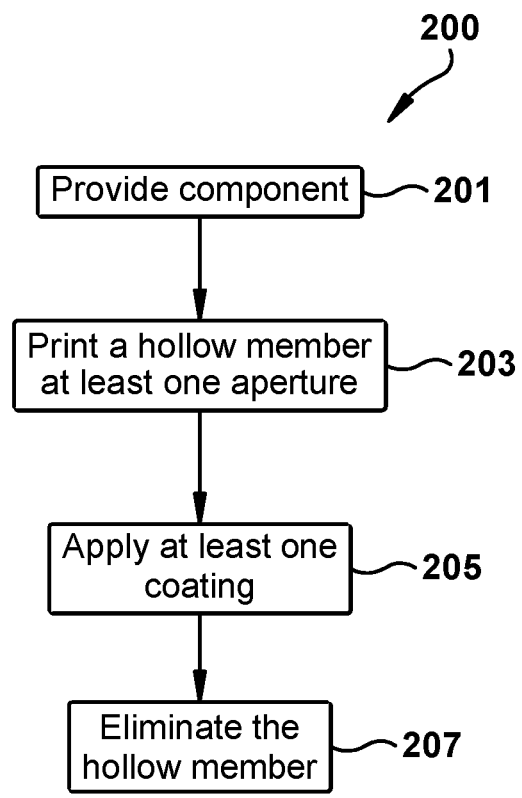
FIG. 2 is a flow chart of a process according to the present disclosure.

As an initial matter, in order to clearly describe the current technology it will become necessary to select certain terminology when referring to and describing relevant components within turbines. To the extent possible, common industry terminology will be used and employed in a manner consistent with its accepted meaning. Unless otherwise stated, such terminology should be given a broad interpretation consistent with the context of the present application and the scope of the appended claims. Those of ordinary skill in the art will appreciate that often a particular component may be referred to using several different or overlapping terms. What may be described herein as being a single part may include and be referenced in another context as consisting of multiple components. Alternatively, what may be described herein as including multiple components may be referred to elsewhere as a single part.

In addition, several descriptive terms may be used regularly herein, and it should prove helpful to define these terms at the onset of this section. These terms and their definitions, unless stated otherwise, are as follows. As used herein, "downstream" and "upstream" are terms that indicate a direction relative to the flow of a fluid, such as the working fluid through the turbine engine or, for example, the flow of air through the combustor or coolant through one of the turbine's component systems. The term "downstream" corresponds to the direction of flow of the fluid, and the term "upstream" refers to the direction opposite to the flow. The terms "forward" and "aft," without any further specificity, refer to directions, with "forward" referring to the front or compressor end of the engine, and "aft" referring to the rearward or turbine end of the engine.

It is often required to describe parts that are disposed at differing radial positions with regard to a center axis. The term "radial" refers to movement or position perpendicular to an axis. For example, if a first component resides closer to the axis than a second component, it will be stated herein that the first component is "radially inward" or "inboard" of the second component. If, on the other hand, the first component resides further from the axis than the second component, it may be stated herein that the first component is "radially outward" or "outboard" of the second component. The term "axial" refers to movement or position parallel to an axis. Finally, the term "circumferential" refers to movement or position around an axis. It will be appreciated that such terms may be applied in relation to the center axis of the turbine.

In addition, several descriptive terms may be used regularly herein, as described below. The terms "first", "second", and "third" may be used interchangeably to distinguish one component from another and are not intended to signify location or importance of the individual components.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Where an element or layer is referred to as being "on," "engaged to," "connected to" or "coupled to" another element or layer, it may be directly on, engaged, connected or coupled to the other element or layer, or intervening elements or layers may be present. In contrast, when an element is referred to as being "directly on," "directly engaged to," "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

As indicated above, the disclosure provides methods for coating components. In particular, the present disclosure is directed to coating methods for selectively coating a component that includes apertures, and a coated component that includes apertures formed by coating methods.

Referring to FIG. 1, in one embodiment, a component 100 includes any suitable component having at least one aperture 109 formed therein. In another embodiment, component 100 includes any suitable component used in applications that undergo temperature changes, such as, but not limited to, power generation systems (e.g., gas turbines, jet turbines, and other turbine assemblies). Suitable illustrative components 100 include, but are not limited to: a nozzle, a blade, a vane, a shroud, a bucket, a transition piece, a liner, or a combination thereof. Aperture 109 includes any opening formed in an external surface 102 of component 100, such as, but not limited to: a cooling hole (e.g., a trench cooling hole, a diffuser shape cooling hole, a straight cooling hole, an angled cooling hole), an opening to provide fuel flow, or a combination thereof, and other cooling hole configurations now known or hereinafter developed.

For example, as shown in FIG. 1, component 100 is illustratively shown as a turbine blade having an airfoil section 103, a platform section 105, and a dovetail section 107. Airfoil section 103 has a plurality of apertures 109 functioning as cooling holes formed therein.

Figure 4:
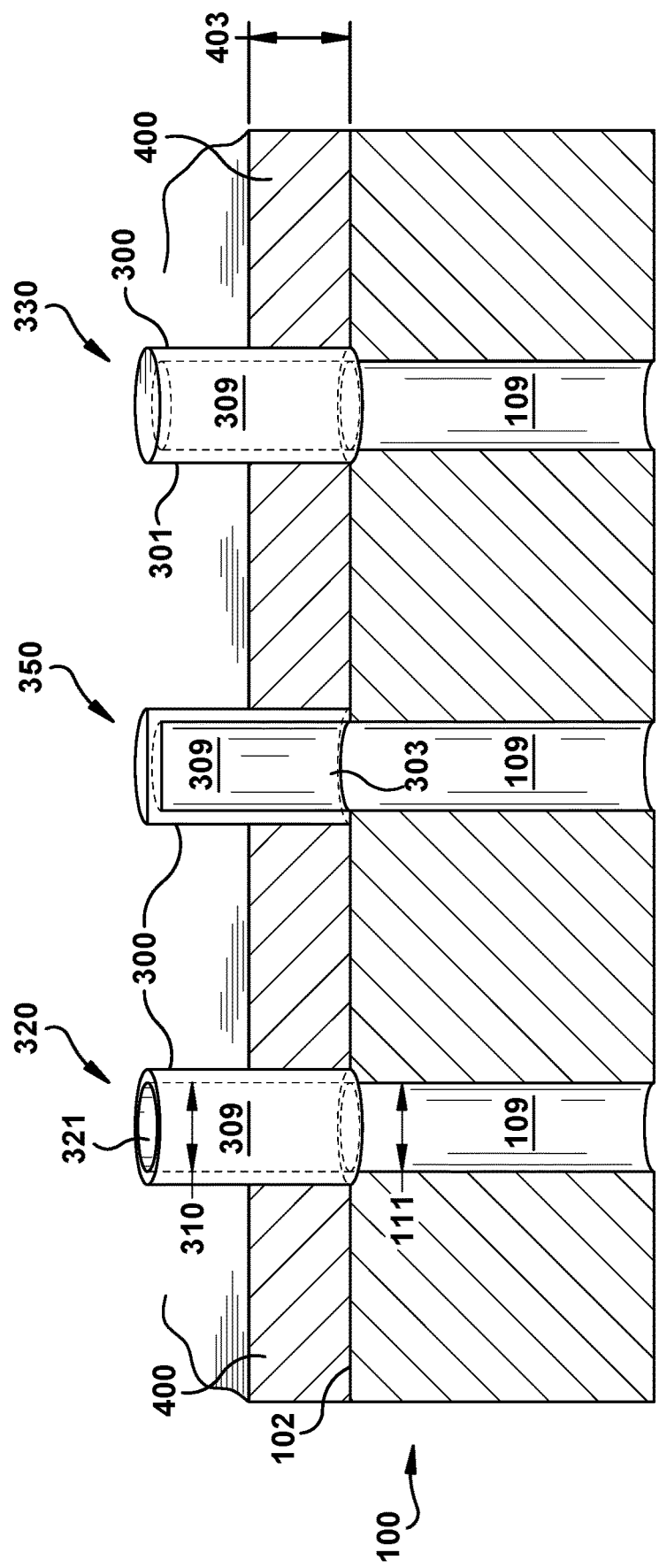
FIG. 4 is a sectional view of a component of FIG. 1 including a plurality of apertures with hollow members and coating formed thereon according to the present disclosure.

In one embodiment, component 100 is fabricated from a high temperature oxidation and corrosion resistant alloy with high temperature strength, such as a nickel-based, cobalt-based, or iron-based superalloy. In another embodiment, component 100 includes a coating 400 (FIG. 4) applied over an external surface 102 of the component. Coating 400 can include any suitable coating covering at least a portion of external surface 102 and/or providing protection (e.g., increased heat tolerance, increased corrosion resistance) to external surface 102, such as, but not limited to, a bond coat, a thermal barrier coating (TBC), an environmental barrier coating (EBC), or a combination thereof, or other coatings now known or hereinafter developed. Suitable examples of the bond coat include, but are not limited to: MCrAlX coatings, where M is cobalt, nickel, iron, or combinations thereof, X is an active element, such as yttrium (Y) and/or silicon (Si) and/or at least one rare earth element or hafnium (Hf). Suitable examples of the TBC include, but are not limited to, ceramic coatings such as zirconium oxide ($ZrO_2$), the crystalline structure of which may be partially or completely stabilized by adding yttrium oxide ($Y_2O_3$), aluminum-oxide, zirconium-oxide, hafnium-oxide, yttria-stabilized zirconium-oxide, metallic material, silicon based materials, graphite, aluminum oxide, yttria-stabilized zirconia, and combinations thereof or other coatings now known or hereinafter developed. In general, an EBC system includes of two or more layers (for example, a bond coat and/or a thermal barrier coat) of coating materials often rare earth or yttrium silicates, in which each layer serves a specific purpose. Thus, this disclosure will focus on application of a layer, as an EBC may contain layers (so addressing a layer will address a plurality of layers in an EBC) t.

Figure 3:
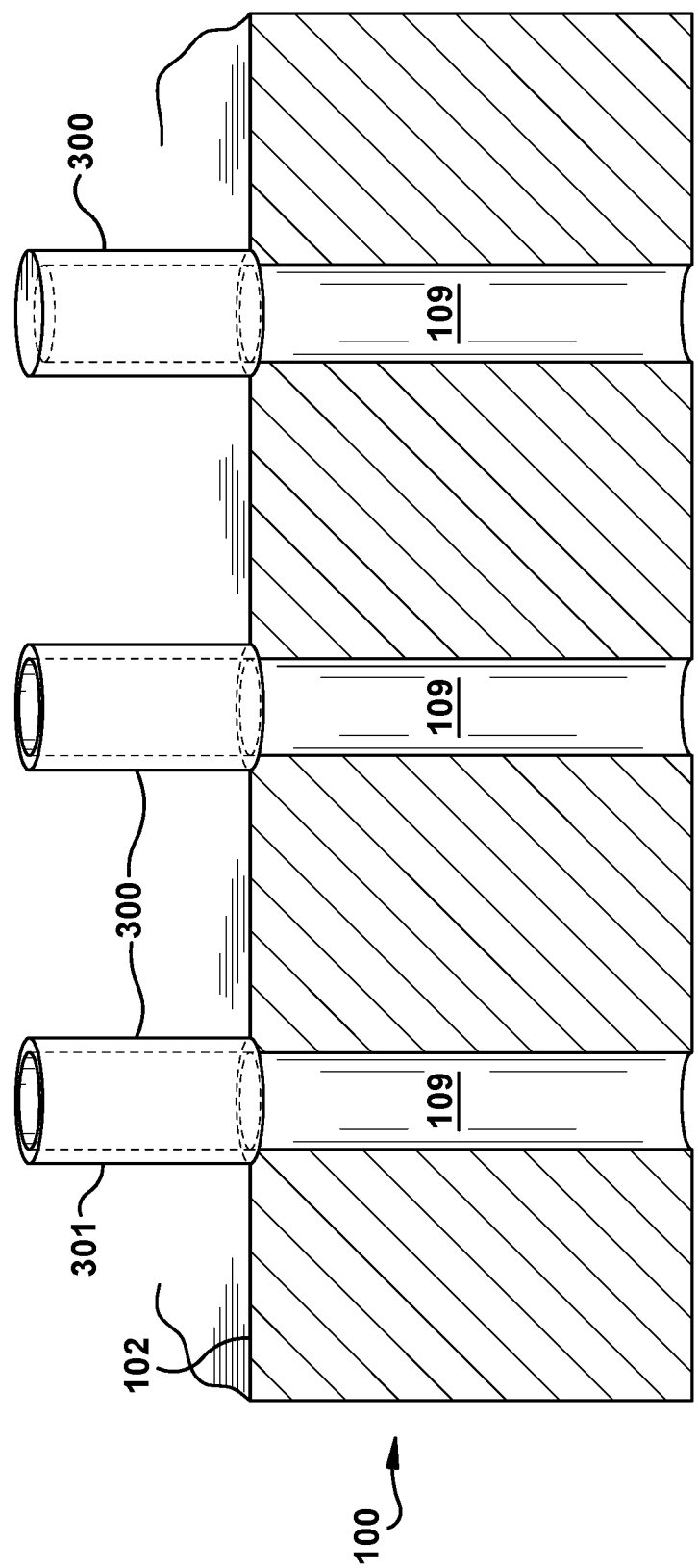
FIG. 3 is a sectional view of a component of FIG. 1 including a plurality of apertures with hollow members formed thereon according to the present disclosure.

Referring to FIGS. 2-5, in one embodiment, a first coating method 200 includes providing component 100 (step 201) having aperture 109 formed in external surface 102 thereof, then additively manufacturing/printing at least one hollow member 300 (step 203) (FIG. 3) on a portion of external surface 102 at aperture 109 to define a space 309 (FIG. 4) above aperture 109. After hollow member 300 is printed (step 203), at least one coating is applied (step 205) over external surface 102 of component 100 and around hollow member 300 to form a layer of coating 400 (FIG. 4) having an applied coating thickness 403 (FIG. 3).

Once coating 400 has been formed, a portion of hollow member 300 is removed (step 207) to expose space 309 through coating 400 to aperture 109. Alternatively, if desired and to reduce the overall thickness of coating 400, portion of coating 400 can be removed with removal of a portion of hollow member 300 (step 207), thus exposing space 309 through coating 400 to aperture 109 with the reduced coating thickness 410.

In one embodiment, hollow member 300 includes a geometry complementary to aperture 109. Suitable complementary geometries for aperture 109 and hollow member 300 include, but are not limited to, tubular, semi-spherical, square, rectangular, cylindrical, elliptical, hour-glass, chevron, any other complementary geometry capable of extending from external surface 102 at aperture 109 (e.g., in a planar or non-planar manner), or combinations thereof. For example, in one embodiment, the geometry of hollow member 300 is complementary to a diffuser-shaped cooling hole.

Hollow member 300 is printed on external surface 102 of component 100 with any suitable height for forming a space 309 coextensive with coating 400 after step 207. Walls of space 309 are formed by the inner walls of hollow member 300, which are essentially collinearly equal to walls of apertures 109.

Figure 5:
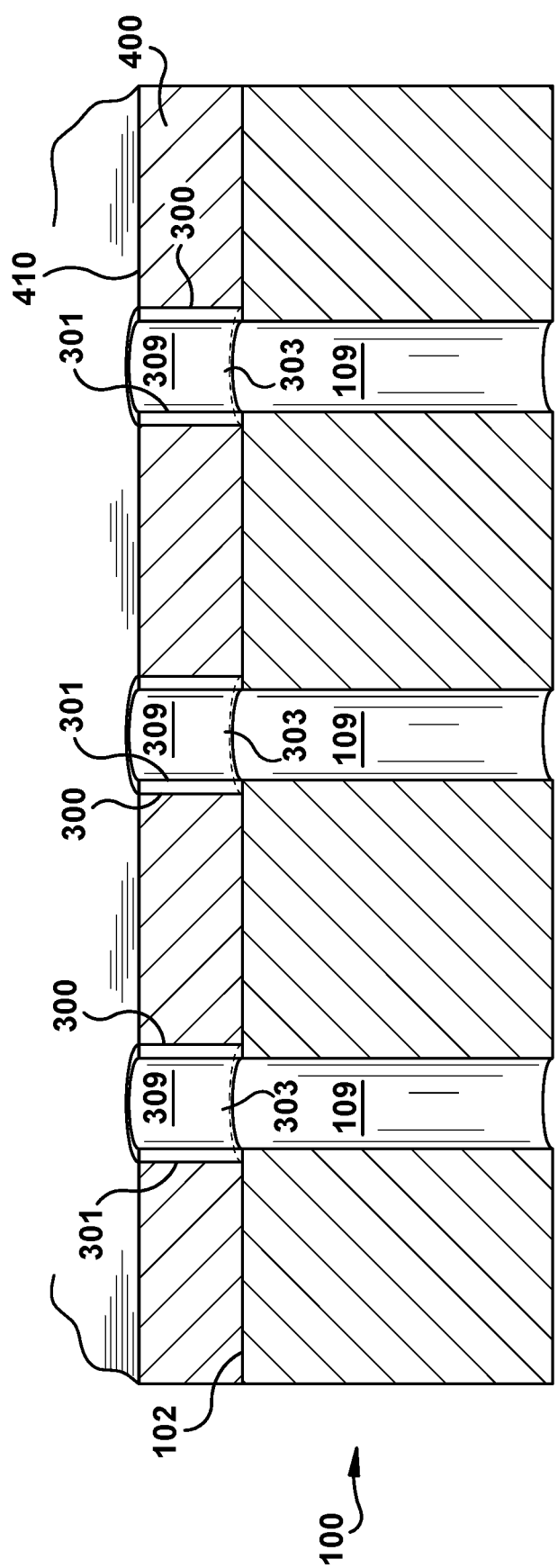
FIG. 5 is a sectional view of a component of FIG. 1 including a plurality of apertures with hollow members and coating formed thereon with portions of hollow members removed according to the present disclosure.

For example, hollow member 300 is printed on component 100 external surface 102 around an aperture 109 to extend away from external surface 102 of component 100 with a height greater than or equal to applied coating thickness 403 (see FIG. 3 or FIG. 5). Suitable coating thickness 403 heights include, but are not limited to, up to about 2.5 millimeters (0.1 inch).

In another aspect, inner perimeter 310 and geometry of hollow member 300 are aligned, equal to, and complementary to an outer perimeter 111 and geometry of aperture 109. This configuration puts aperture 109 and hollow member 300 coaxial with each other. The configuration also permits a smooth linear transition from aperture 109 to hollow member 300, essentially forming a coplanar transitional inner surface from aperture 109 to hollow member 300.

Hollow member 300 is formed by any suitable 3-D printing process, printing process, or additive manufacturing processes (hereinafter collectively "additive manufacturing processes"), such as, but not limited to, a wide variety of processes of producing a component through the successive layering of material rather than the removal of material. As such, additive manufacturing can create complex geometries for hollow member 300 without the use of any sort of tools, molds or fixtures, and with little or no waste material. Instead of machining hollow member 300 from solid billets of material, much of which is cut away and discarded, the only material used in additive manufacturing is what is required to print hollow member 300.

Additive manufacturing techniques typically include taking a three-dimensional computer aided design (CAD) file of the component to be formed (here hollow member 300 on a build platform formed by external surface 102 of component 100), electronically slicing the component into layers, e.g., 18-102 micrometers thick, and creating a file with a two-dimensional image of each layer, including vectors, images or coordinates. The file may then be loaded into a preparation software system that interprets the file such that hollow member 300 can be built by different types of additive manufacturing systems. In 3D printing, rapid prototyping (RP), and direct digital manufacturing (DDM) forms of additive manufacturing, material layers are selectively dispensed, sintered, formed, deposited, etc., to create the hollow member 300.

In powder additive manufacturing techniques, such as direct metal laser melting (DMLM) (also referred to as selective laser melting (SLM)), powder layers are sequentially melted together to form the component. More specifically, fine powder layers are sequentially melted after being uniformly distributed using an applicator on a powder bed. Each applicator includes an applicator element in the form of a lip, brush, blade or roller made of metal, plastic, ceramic, carbon fibers or rubber that spreads the powder evenly over the build platform. The powder bed can be moved in a vertical axis. The process takes place in a processing chamber having a precisely controlled atmosphere. Once each layer is created, each two dimensional slice of the component geometry can be fused by selectively melting the powder. The melting may be performed by a high powered melting beam, such as but not limited to, a 100 Watt ytterbium laser, to fully weld (melt) the metal powder to form a solid. The melting beam moves in the X-Y direction using scanning mirrors, and has an intensity sufficient to fully weld (melt) the powder to form a solid. The powder bed may be lowered for each subsequent two dimensional layer, and the process repeats until the component is completely formed.

Referring again to FIGS. 2-5, after printing/additively manufacturing hollow member 300 (step 203), at least one coating 400 is applied (step 205) over external surface 102 of component 100 by any suitable application method for forming coating 400 with applied coating thickness 403. Suitable application methods include, but are not limited to: air plasma spray, high velocity oxygen fuel (HVOF) thermal spray, or electron beam physical vapor deposition or other application method now know or hereinafter developed. During the application (step 205) of the at least one coating, orientation and geometry of hollow member 300 with respect to the coating being applied (as described hereinafter) reduces or eliminates deposition of coating 400 material in any portion of hollow member 300 (e.g., aperture 109 and space 309 (see FIG. 4)).

Once coating(s) 400 has been applied (step 205), upper portion 301 of hollow member 300 may be removed (Step 207). Moreover, as noted herein, a portion of coating 400 can be optionally removed by any suitable removal method to provide the desired coating thickness 403, if applied coating 400 (Step 205) is too thick. Thus, top surface 410 (FIG. 5) of coating 400 will be coplanar with the remaining portions of hollow member 300, after removal. Suitable removal methods include, but are not limited to: machining, sanding, grit-blasting etching, polishing, or a combination thereof. For example, in one embodiment, the coating removal includes polishing coating 400 with a diamond pad.

In one aspect of the disclosure, upper portion 301 (FIG. 4) of hollow member 300 includes an upper geometry that differs from a lower geometry of lower portion 303. For example, hollow member 350 in FIG. 4 includes a rectangular printed upper section, which is merely illustrative and not intended to limit the embodiments of the disclosure in any manner. This different upper geometry may be such that hollow member 300, if open at the end remote from aperture 109 (see hollow member 320 in FIG. 4 with open end 321) is configured to exclude coating 400 from entering hollow member 300. With printing/additively manufacturing the hollow member 300, upper portion 301 can be closed (see hollow member 330 in FIG. 4), or open to a degree resisting entry of coating 400, especially if coating 400 is sprayed.

Furthermore, as discussed herein, lower portion 303 geometry may conform to the geometry of aperture 109, and upper geometry 301 may confirm to the geometry of aperture 109 or include any other configuration or shape extending from lower portion 303. For example, and in no way intended to limit the disclosure, hollow member 300 at lower portion 303 may include a conforming geometry to a circular aperture 109 transitioning to an ellipsoid geometry in upper portion 301 extending away from external surface 102.

When upper portion 301 is removed (step 207) parts of upper and lower portions 301, 303 remain to define space 309, as shown in FIG. 5. In one embodiment, the geometry of the space 309 includes, but is not limited to: cylindrical, spherical, square, rectangular, domed, oblong, trapezoidal, curved, straight, skewed, irregular, any other shape permitting flow therethrough, or a combination thereof.

A further aspect of the disclosure includes printing/additively manufacturing angled hollow members 500 in conjunction with angled apertures 102 (including but not limited to those used for film cooling turbine components), as illustrated in FIGS. 6-8. Like reference characters are used for like elements.

In FIGS. 6-8, angled hollow members 500 are printed on a portion of external surface 102 at angled aperture 109 to define a space 509 above angled aperture 109, usually oval or ellipsoid given the intersecting aperture 109 at surface 102. As in the above embodiments, angled hollow member 500 includes a geometry complementary to aperture 109. Also, inner perimeter 510 and geometry of angled hollow member 500 can be equal to and complementary to an outer perimeter 111 and geometry of angled aperture 109 at surface 102. Accordingly, angled aperture 109 and angled hollow member 500 essentially form a coplanar transitional surface from angled aperture 109 to hollow member 500, and hollow member 500 is essentially collinear with walls of angled apertures 109.

Hollow member 500 is printed on external surface 102 of component 100 with any suitable height for forming a space 509 with the to-be-applied coating 400. Walls of space 509 are formed by the inner walls of hollow member 500, with walls of space 509 essentially collinear to walls of apertures 109.

Hollow member 500 is printed (in any suitable printing or additive manufacturing process as described above) on component 100 external surface 102 around angled aperture 109 to extend away from external surface 102 of component 100 at an angle coincident with the angle of aperture 109. This configuration puts aperture 109 and hollow member 500 coaxial with each other. As above, hollow member 500 has a height greater than or equal to the applied coating thickness 403.

After printing/additively manufacturing hollow member 500, at least one coating 400 is applied over external surface 102 of component 100 by any suitable application method for forming coating 400 with applied coating thickness 403. During the application of coating(s) 400, the orientation and geometry of hollow member 500 being angled with respect to an applicator/sprayer of coating material reduces or eliminates coating material on or in aperture 109 and space 509. When upper portion 501 is removed as in FIG. 8, parts of upper and lower portions 501, 503 remain to define space 509. Thus, top surface of coating 410 is coplanar with remaining portions of hollow member 500, after removal. Moreover, if needed to achieve a desired coating thickness 403, removal of some portion of coating(s) 400 can occur with removal of hollow member 500.

With respect to a process for applying coating 400, as discussed above, coating(s) 400 is applied over external surface 102 of component 100 by any suitable applicator/sprayer and application method for forming coating 400 with applied coating thickness 403. One suitable application method, as noted above, is by spraying coating(s) 400.

With any of the embodiments herein, a spraying coating applicator/sprayer may include a spray gun with a spray head that can be disposed at an angle with respect to apertures 109 in component 100. An angled spray head is effective to reduce spray entering aperture 109, as angles of aperture 109 (including those essentially orthogonal to surface 102) and of hollow members 300, 500 and may not align with the spray, thus spray should not directly enter apertures 109. Moreover, as apertures 109 are provided with printed hollow members 300, 500, angled spray heads can provide enhanced coverage between apertures 109 and hollow members 300, 500. With hollow members 300, 500 any spray and coating(s) 400 should be kept from entering apertures 109, which enables more efficient and effective consumption of coating without wasted spray in apertures 109 needing to be removed and scrapped.

FIG. 9 illustrates this aspect of the embodiments with spray gun 550 having an angled spray head 555. Moreover, angled spray head 555 can be an adjustable angled spray head 555 to move its orientation to surface 102 between 0 degrees (orthogonal to surface 102) to almost 90 degrees or almost parallel to surface 102. As is illustrated, angled spray head 555 can have a direct line of spray in-between printed hollow members, as shown for a set 500A of hollow members, or have an offset line of spray in-between printed hollow members, as shown for a set 500B of hollow members. One desirable angle is about 20 degrees from orthogonal, however that angle is not intended to limit the embodiments in any manner. With hollow members 300, 500 spray and coating are kept from entering apertures 109, which enables more efficient and effective consumption of coating without wasted spray in apertures 109 needing to be removed and scrapped.

One advantage of an embodiment of the present disclosure includes maintaining original shape and dimension of apertures or cooling holes in coated components. Another advantage of an embodiment is better control of airflow for coated components. Yet another advantage is faster processing of coated components. Another advantage of an embodiment is decreased time for cleaning of cooling holes after components are coated or recoated. Yet another advantage includes significant labor savings because no drilling is required to clear cooling holes after coating.

Components of the present disclosure can be used in any applications that undergo temperature changes, such as, but not limited to, power generation systems which include, but are not limited to: gas turbines, steam turbines, jet turbines, and other turbine assemblies. Moreover, embodiments of the present disclosure, in comparison to coating methods not using one or more of the features disclosed herein, increase coating efficiency, provide apertures through a coating without post-coating clearing, increase control of airflow for coated components, decrease coating cost, decrease coating time, decreased time for cleaning apertures after coating components, or a combination thereof.

The foregoing drawings show some of the processing associated according to several embodiments of this disclosure. In this regard, each drawing or block within a flow diagram of the drawings represents a process associated with embodiments of the method described. It should also be noted that in some alternative implementations, the acts noted in the drawings or blocks may occur out of the order noted in the figure or, for example, may in fact be executed substantially concurrently or in the reverse order, depending upon the act involved. Also, one of ordinary skill in the art will recognize that additional blocks that describe the processing may be added.

Approximating language, as used herein throughout the specification and claims, may be applied to modify any quantitative representation that could permissibly vary without resulting in a change in the basic function to which it is related. Accordingly, a value modified by a term or terms, such as "about," "approximately" and "substantially," are not to be limited to the precise value specified. In at least some instances, the approximating language may correspond to the precision of an instrument for measuring the value. Here and throughout the specification and claims, range limitations may be combined and/or interchanged; such ranges are identified and include all the sub-ranges contained therein unless context or language indicates otherwise. "Approximately" as applied to a particular value of a range applies to both end values, and unless otherwise dependent on the precision of the instrument measuring the value, may indicate+/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A coating method, comprising:
   additively manufacturing a hollow member on a portion of a surface of a component having at least one aperture formed in the surface, the hollow member defining a space above the at least one aperture, the portion of the surface being adjacent to the at least one aperture, the hollow member having an inner peripheral geometry complementary to a peripheral geometry of the at least one aperture and an open end;
   applying at least one coating only over the surface of the component around the hollow member to form an applied coating on the surface of the component having an applied coating thickness; wherein the applying the at least one coating includes applying the at least one coating only around the hollow member; and
   removing a portion of the hollow member to make a top portion of the hollow member coplanar with the applied coating to expose the space through the applied coating, wherein a lower portion of the hollow member remains to define the space through the applied coating.

2. The coating method of claim 1, wherein the coating and the hollow member include at least one of a thermal barrier coating composition, an environmental barrier coating composition, and a bond coat composition.

3. The coating method of claim 1, wherein additively manufacturing the hollow member includes additively manufacturing the hollow member coincident with the at least one aperture.

4. The coating method of claim 3, wherein additively manufacturing the hollow member coincident with the at least one aperture includes aligning an inner periphery of the hollow member with an outer perimeter of the at least one aperture to define a coplanar transitional surface therein.

5. The coating method of claim 3, wherein the at least one aperture defines an axis disposed at a non-perpendicular angle to the surface, and additively manufacturing the hollow member includes additively manufacturing the hollow member coincident with the at least one aperture and coaxial with an axis of the at least one aperture.

6. The coating method of claim 1, further comprising the hollow member and the coating are selected from ceramic material, aluminum-oxide, zirconium-oxide, hafnium-oxide, yttria-stabilized zirconium-oxide, metallic material, silicon based materials, graphite, aluminum oxide, yttria-stabilized zirconia, and combinations thereof.

7. The coating method of claim 1, wherein the component is selected from the group including a nozzle, a blade, a vane, a shroud, a bucket, a transition piece, a liner, and combinations thereof.

8. The coating method of claim 1, wherein the removing includes machining, grit-blasting, sanding, etching, polishing or combinations thereof.

9. The coating method of claim 1, wherein applying at least one coating includes air plasma spraying, high velocity oxygen fuel (HVOF) thermal spraying, or electron beam physical vapor deposition.

10. The coating method of claim 1, wherein applying at least one coating includes spraying a coating with a spray gun, the spray gun including a spray head disposed at an angle to the at least one aperture.

11. The coating method of claim 1, further comprising removing a portion of the applied coating to provide a reduced coating thickness.

12. The coating method of claim 11, wherein applying at least one coating includes applying a coating to a thickness up to about 2.5 millimeters (0.1 inch).

13. The coating method of claim 11, wherein removing the portion of the applied coating further comprises removing the portion of the hollow member.

14. The coating method of claim 1, wherein the applying the at least one coating only over the surface of the component around the hollow member further includes applying the at least one coating only to the surface of the component and not applying the at least one coating on the open end of the hollow member.

15. The coating method of claim 1, wherein the applying the at least one coating only over the surface of the component around the hollow member further includes applying the at least one coating only to the surface of the component and not applying the at least one coating in the open end of the hollow member.

* * * * *